United States Patent
Wang et al.

(10) Patent No.: US 10,625,375 B2
(45) Date of Patent: Apr. 21, 2020

(54) LASER PROCESSING METHOD, APPARATUS FOR SAPPHIRE AND STORAGE MEDIUM

(71) Applicant: HAN'S LASER TECHNOLOGY INDUSTRY GROUP CO., LTD., Shenzhen (CN)

(72) Inventors: Yanhua Wang, Shenzhen (CN); Zhixian Chen, Shenzhen (CN); Changhui Zhuang, Shenzhen (CN); Guodong Ma, Shenzhen (CN); Fuhai Li, Shenzhen (CN); Wei Zhu, Shenzhen (CN); Jiangang Yin, Shenzhen (CN); Yunfeng Gao, Shenzhen (CN)

(73) Assignee: Han's Laser Technology Industry Group Co., Ltd., Shenzhen (CN)

( * ) Notice: Subject to any disclaimer, the term of this patent is extended or adjusted under 35 U.S.C. 154(b) by 405 days.

(21) Appl. No.: 15/321,946

(22) PCT Filed: Apr. 29, 2016

(86) PCT No.: PCT/CN2016/080638
§ 371 (c)(1),
(2) Date: Dec. 23, 2016

(87) PCT Pub. No.: WO2016/180246
PCT Pub. Date: Nov. 17, 2016

(65) Prior Publication Data
US 2017/0151632 A1    Jun. 1, 2017

(30) Foreign Application Priority Data
May 12, 2015    (CN) .......................... 2015 1 0239300

(51) Int. Cl.
*B23K 26/351*    (2014.01)
*B23K 26/53*    (2014.01)
(Continued)

(52) U.S. Cl.
CPC ........ *B23K 26/351* (2015.10); *B23K 26/0006* (2013.01); *B23K 26/032* (2013.01);
(Continued)

(58) Field of Classification Search
CPC ................................................. G06T 7/10–194
See application file for complete search history.

(56) References Cited

U.S. PATENT DOCUMENTS 5,727,433 A * 3/1998 Pomerleau ............... B26D 5/00
                                                              700/130
6,580,054 B1 * 6/2003 Liu ....................... B23K 26/032
                                                              219/121.68
(Continued)

FOREIGN PATENT DOCUMENTS

CN    103785957 A    5/2014
CN    104508799 A    4/2015
(Continued)

OTHER PUBLICATIONS

English Translation of the International Search Report, dated Jul. 26, 2016, from International Application No. PCT/CN2016/080638, filed Apr. 29, 2016. Three pages.

*Primary Examiner* — Jodi C Franklin
(74) *Attorney, Agent, or Firm* — HoustonHogle LLP

(57) ABSTRACT

A laser processing method for a sapphire includes: acquiring an image of the sapphire during processing; performing an edge detection to the image to acquire a coordinate of a crack; determining an offset parameter according to the coordinate of the crack; adjusting a laser processing position according to the offset parameter; and further processing the sapphire in accordance with the adjusted laser processing position.

19 Claims, 9 Drawing Sheets

(51) Int. Cl.
*H01L 21/66* (2006.01)
*B23K 26/00* (2014.01)
*B23K 26/03* (2006.01)
*C03C 23/00* (2006.01)
*H01L 21/67* (2006.01)
*H01L 33/00* (2010.01)
*B23K 101/36* (2006.01)
*B23K 103/00* (2006.01)

(52) U.S. Cl.
CPC .......... *B23K 26/53* (2015.10); *C03C 23/0025* (2013.01); *H01L 21/67115* (2013.01); *H01L 21/67253* (2013.01); *H01L 22/20* (2013.01); *H01L 33/0095* (2013.01); *B23K 2101/36* (2018.08); *B23K 2103/50* (2018.08)

(56) References Cited

U.S. PATENT DOCUMENTS

| | | | | |
|---|---|---|---|---|
| 7,112,518 | B2* | 9/2006 | Liu | B23K 26/032 438/487 |
| 8,822,882 | B2* | 9/2014 | Liu | B23K 26/032 219/121.69 |
| 8,829,391 | B2* | 9/2014 | Kurachi | B23K 26/18 219/121.72 |
| 9,099,546 | B2* | 8/2015 | Nakamura | H01L 21/78 |
| 9,610,653 | B2* | 4/2017 | Zhang | B23K 26/0006 |
| 2002/0031899 | A1* | 3/2002 | Manor | B23K 26/0093 438/460 |
| 2002/0088952 | A1* | 7/2002 | Rao | G01N 21/9501 250/559.45 |
| 2004/0002199 | A1* | 1/2004 | Fukuyo | B23K 26/03 438/460 |
| 2005/0062960 | A1* | 3/2005 | Tsuji | G01N 21/9503 356/237.2 |
| 2009/0224432 | A1* | 9/2009 | Nagatomo | B23K 26/032 264/400 |
| 2009/0263024 | A1* | 10/2009 | Yamaguchi | G06T 7/0006 382/199 |
| 2012/0077296 | A1* | 3/2012 | Yamada | H01L 33/0095 438/33 |
| 2012/0328156 | A1* | 12/2012 | Nakano | G06T 7/12 382/103 |
| 2013/0122619 | A1* | 5/2013 | Aikawa | H01L 33/0095 257/E33.06 |
| 2013/0251036 | A1* | 9/2013 | Lee | H04N 19/593 375/240.12 |
| 2015/0140241 | A1* | 5/2015 | Hosseini | B23K 26/0617 428/34.4 |
| 2015/0346108 | A1* | 12/2015 | Palmieri | G01N 21/87 356/30 |
| 2017/0146696 | A1* | 5/2017 | Hongo | G02B 1/118 |

FOREIGN PATENT DOCUMENTS

| | | |
|---|---|---|
| CN | 104584195 A | 4/2015 |
| CN | 104827191 A | 8/2015 |
| JP | H10323780 A | 12/1998 |
| JP | 2003088975 A | 3/2003 |
| JP | 2011181909 A | 9/2011 |
| JP | 2014087806 A | 5/2014 |

\* cited by examiner

LASER PROCESSING METHOD, APPARATUS FOR SAPPHIRE AND STORAGE MEDIUM

This application is a § 371 National Phase Application of International Application No. PCT/CN2016/080638, filed on Apr. 29, 2016, which claims priority to Chinese application No. 201510239300.X, entitled, "LASER PROCESSING METHOD FOR SAPPHIRE", filed May 12, 2015. The entire teachings of the above applications are incorporated herein by reference.

FIELD OF THE INVENTION

The present disclosure relates to a technical field of laser processing, and more particularly relates to a laser processing method, apparatus for sapphire and storage medium.

BACKGROUND OF THE INVENTION

In the laser micro-precision machining for semiconductors such as LED wafer and the like, the sapphire substrate to be used is usually a wafer with a c-plane. As illustrated in FIG. 1, during a laser dicing process of the LED wafer, the whole piece of circular wafer needs to be split into a plurality of single core particles with rectangular shape. Two mutually perpendicular dicing directions are generally corresponding to an a-plane and an m-plane of the sapphire crystal, and the a-plane and the m-plane are both perpendicular to the c-plane. Since the m-plane is close to the r-plane (cleavage plane), and the r-plane is not perpendicular to the c-plane and forms a certain inclination angle with the c-plane, the single final core particle will actually be cracked along the r-plane after laser dicing, such that there is a certain deviation between the laser machining point corresponding to the CCD (charge-coupled device) camera and the actual cracking position of the wafer, thus causing the actual crack to deviate from the intermediate position of the dicing path. When the dicing path has a greater width, the actual crack does not extend into the emitting electrode region (electrode) of the chip. However, during the actual process, in order to increase production as much as possible, the width of the dicing path becomes increasingly smaller. If the crack deviates from the intermediate position of the dicing path, the emitting electrode region of the chip will be scratched, thereby affecting the final yield.

SUMMARY OF THE INVENTION

According to various embodiments, the present disclosure is directed to a laser processing method, apparatus for sapphire and a storage medium.

A laser processing method for a sapphire includes:
acquiring an image of the sapphire during processing;
performing an edge detection to the image to acquire a coordinate of a crack;
determining an offset parameter according to the coordinate of the crack;
adjusting a laser processing position according to the offset parameter; and
further processing the sapphire in accordance with the adjusted laser processing position.

A laser processing apparatus for the sapphire is provided, which includes a processor; and memory storing instructions, which, when executed by the processor cause the processor to perform operations including:

acquiring an image of the sapphire during processing;
performing an edge detection to the image to acquire a coordinate of a crack; determining an offset parameter according to the coordinate of the crack;
adjusting a laser processing position according to the offset parameter; and
further processing the sapphire in accordance with the adjusted laser processing position.

A non-transitory computer-readable medium storing instructions, which, when executed by one or more processors cause the one or more processors to perform operations including:
acquiring an image of the sapphire during processing;
performing an edge detection to the image to acquire a coordinate of a crack;
determining an offset parameter according to the coordinate of the crack;
adjusting a laser processing position according to the offset parameter; and
further processing the sapphire in accordance with the adjusted laser processing position.

These and other objects, advantages, purposes and features will become apparent upon review of the following specification in conjunction with the drawings.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

The above objects, features and advantages of the present invention will become more apparent by describing in detail embodiments thereof with reference to the accompanying drawings. Further, those of ordinary skill in the relevant art will understand that they can practice other embodiments of the disclosure without one or more of the details described below.

Figure 1:
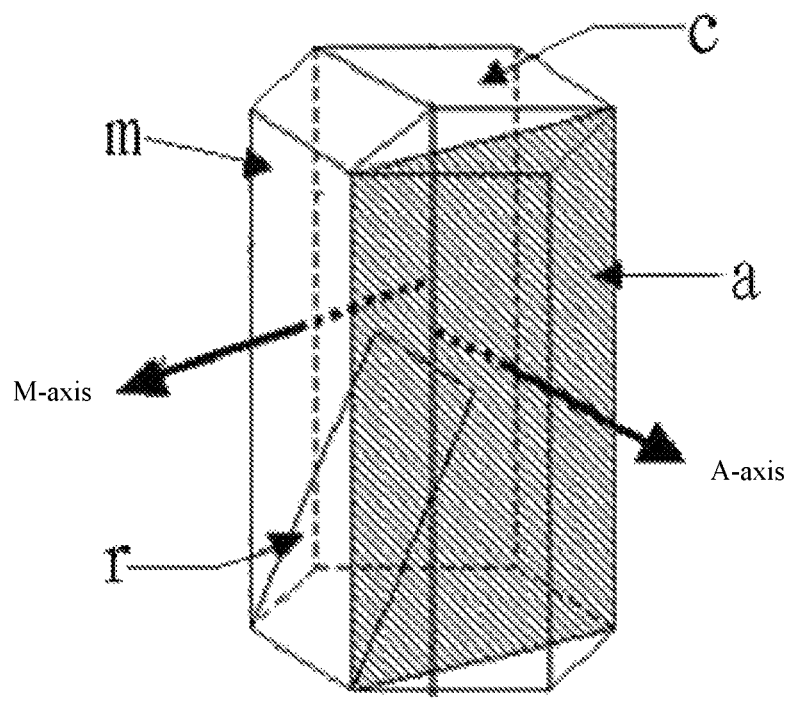
FIG. 1 is a unit cell diagram of a sapphire according to an embodiment.
Figure 2:
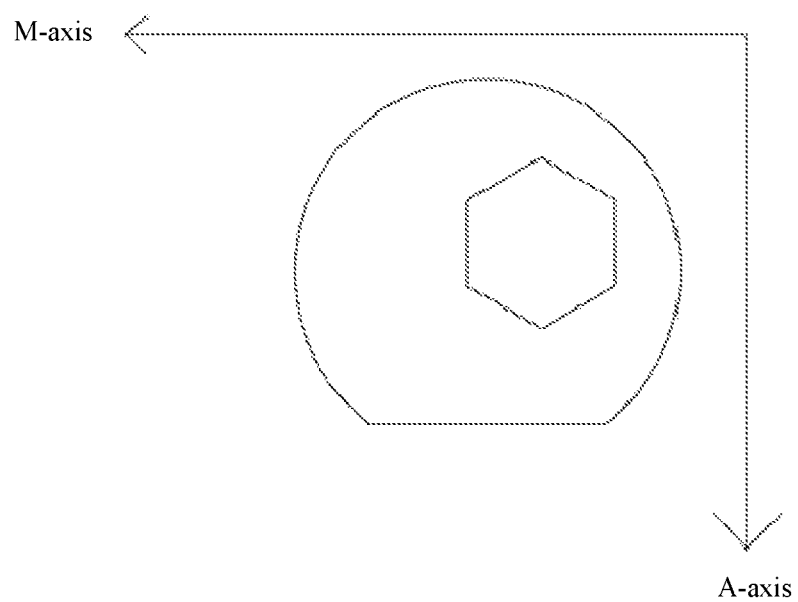
FIG. 2 is a plan view illustrating a dicing direction of a sapphire wafer according to an embodiment.

FIG. 1 illustrates a unit cell diagram of a sapphire. The sapphire substrate used in the LED field is usually a wafer with a c-plane. Two mutually perpendicular dicing directions of the wafer are generally corresponding to an m-plane and an a-plane. Referring to FIG. 2, the two dicing directions for the wafer are m-axis and a-axis, which are perpendicular to the m-plane and the a-plane, respectively. FIG. 2 is a projection of FIG. 1 in the c-plane, where the flat edge is parallel to the m-axis.

As can be seen from FIG. 1, the m-plane is close to the r-plane (cleavage plane). When dicing the m-plane, the wafer tends to be cracked at the r-plane due to the characteristic of the r-plane of the sapphire crystal. Accordingly, after laser dicing, the actual cracking plane is the r-plane rather than the m-plane, such that there is a certain inclination angle between the r-plane and the c-plane in the processed sample.

Figure 3:
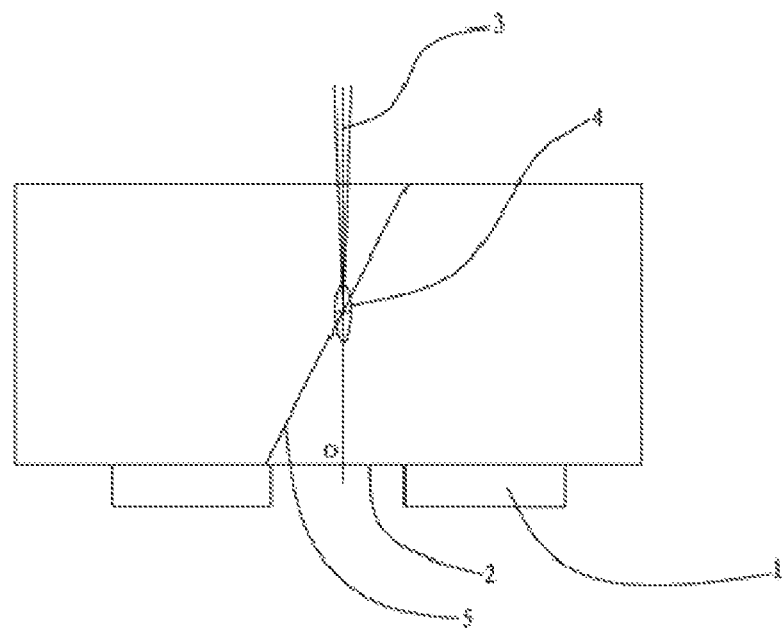
FIG. 3 is a section view illustrating a conventional dicing method of a sapphire wafer along an intermediate position of the dicing path.

Referring to FIG. 3, in the LED wafer laser dicing industry, the laser beam is focused within the sapphire substrate to form a plurality of converging points, and the sapphire is cracked using the stress formed by the converging points. An electrode 1 with rectangular periodic patterns is grown on the sapphire substrate, which is separated by dicing paths 2 perpendicular to each other. Since the r-plane is inclined cracked, the actual cracking position may not be in an intermediate position of the dicing path 2, or the crack may even reach the patterning region of the electrode 1, such that the defective products are produced, and the yield is reduced.

The cracking direction of the r-plane is observed from the cross-section of the a-plane. The laser beam 3 is radiated vertically to the inside of the sapphire substrate to form a converging point 4, and the incident position of the laser beam 3 is aligned with the intermediate position O of the dicing path 2. However, due to the presence of the r-plane, the actual crack 5 is not located at the intermediate position O of the dicing path 2, which results in an uneven of the electrode surface and affects the processing yield. When the width of the dicing path is less than 30 μm or even less, the crack 5 tends to extend into the electrode 1, thus producing defective products.

Figure 4:
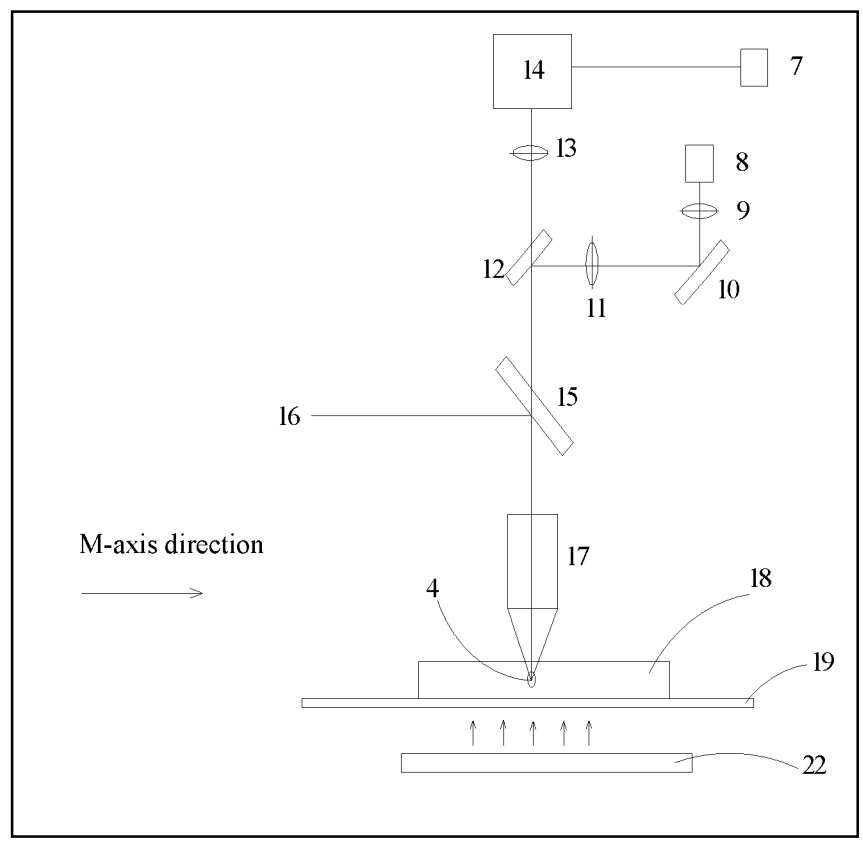
FIG. 4 is a schematic structural diagram of a laser processing apparatus for a sapphire wafer according to an embodiment.

FIG. 4 is a schematic diagram of a laser processing system for sapphire. In the laser processing system, an apparatus 7 serves as a control device for the processing environment, which can control each component of the processing environment for implementing a laser processing method. A laser condenser lens 17 has both a laser processing function and an imaging function. A CCD camera 14 is configured to observe a surface image and the crack of a sapphire wafer 18. During the specific imaging procedure, a point light source 8 and a surface light source 22 are switched on simultaneously, such that an optimal imaging results of the back of the sapphire can be achieved, and the image is easy to identify to facilitate image acquisition. The CCD camera 14 is connected to the apparatus 7, thus a monitor of the apparatus 7 can display the image within an entire imaging field of view of the CCD camera. A laser beam 16 goes through a beam splitter 12 and enters a condenser lens 17, the focus is adjusted to the inside of the sapphire 18 to form a laser converging point 4. A mounting table 19 performs a straight line uniform motion along an a-axis direction, such that the m-plane of the sapphire is processed.

Figure 5:
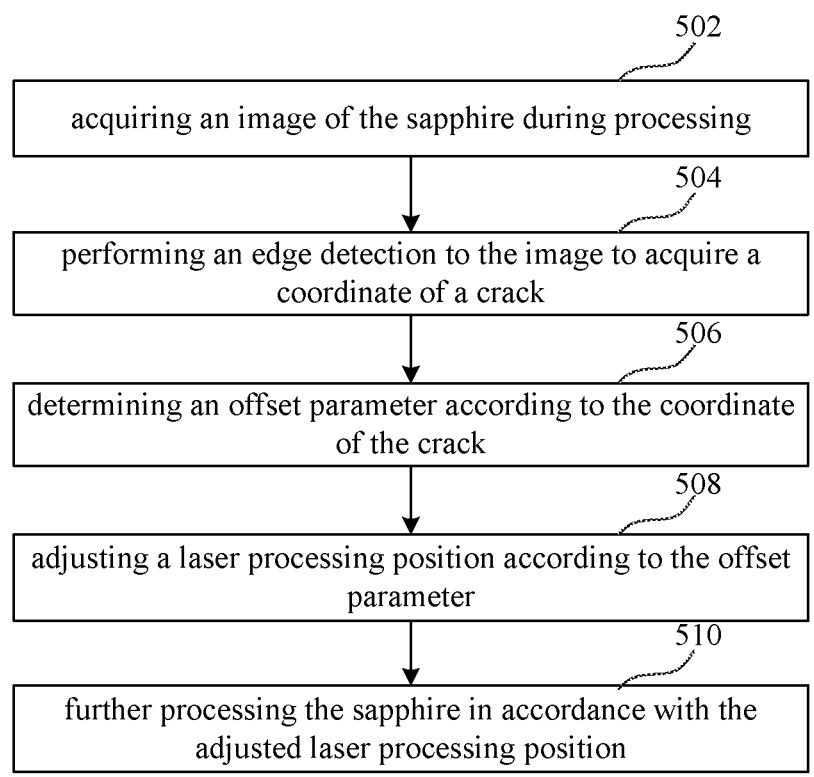
FIG. 5 is a flow chart of a laser processing method for a sapphire according to an embodiment.

Referring to FIG. 5, a laser processing method for the sapphire is provided. In the illustrated embodiment, the method can be applied to the laser processing system for the sapphire shown in FIG. 4. The apparatus 7 can run a laser processing program for the sapphire, and the laser processing method is implemented by the laser processing program for the sapphire. The method specifically includes the following steps.

In step 502, an image of the sapphire during processing is acquired.

Specifically, during the sapphire processing, the apparatus 7 can acquire the image of the sapphire via the CCD camera 14, which is connected to the apparatus 7. The CCD camera 14 can transfer the image of the sapphire within the field of view to the apparatus 7, then the apparatus 7 can display the image within the field of view of the CCD camera 14 on the monitor. The image can be a partial image magnified according to a certain multiple by the CCD camera during the laser processing, such that the crack generated during the sapphire processing can be observed from the partial image magnified according to a certain multiple.

In one embodiment, the step 502 includes: processing the sapphire along an intermediate point of any dicing path, thus forming the crack on the sapphire; and acquiring the image of the sapphire with the crack.

Figure 6:
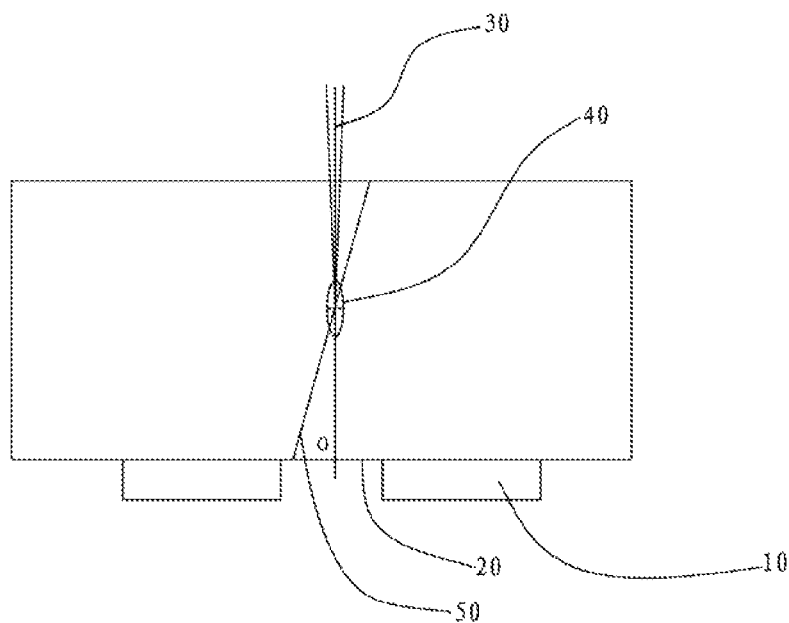
FIG. 6 is a section view illustrating a dicing method of a sapphire wafer along the intermediate position of the dicing path according to an embodiment.

Specifically, referring to FIG. 6, at the m-plane, the processing begins by positioning the laser beam to be aligned with the intermediate position O of any dicing path 20. The laser beam 30 will radiate vertically into the sapphire substrate at the intermediate position O of any dicing path 20, and the converging point 40 is formed within the sapphire. An actual crack 50 will be generated, which however is not located at the intermediate position O of the dicing path 20. The apparatus 7 can acquire the image of the sapphire with the crack 50 via the CCD camera, and the image of the sapphire with the crack 50 can be displayed, such that the crack 50 of the sapphire can be observed from the image of the sapphire. By reducing the width of the dicing path 20, the yield of the single chip manufactured from the same wafer can be increased. The sapphire includes a front face and a rear face with an electrode 10, the interleaved dicing path 20 is formed on the rear face, and the electrode 10 is separated by the dicing path 20.

In one embodiment, acquiring the image of sapphire with the crack includes: controlling a light source and radiating light generated by the light source onto the sapphire with the crack; and acquiring the image of the sapphire radiated by the light.

In one embodiment, acquiring the image of the sapphire radiated by the light includes: transmitting an image capturing instruction to a CCD camera, and acquiring, by the CCD camera, the image of the sapphire radiated by the light in a field of view according to the image capturing instruction.

Specifically, referring to FIG. 4, the apparatus 7 can control the point light source 8 and the surface light source 22. Light emitted from the point light source 8 goes through a convex lens 9, a 45 degree reflector, a convex lens 11, a beam splitter 12, and enters the condenser lens 17. The convex lens 9 and the convex lens 11 are conjugated lens sets, which are configured to transfer diverging light from the point light source 8 into parallel light. The point light source 8 emits parallel white light, which is focused at the rear face of the sapphire 18 by the condensed lens, and is reflected to the beam splitter 12 and enters a convex lens 13, and finally reaches the CCD camera 14. By reasonably adjusting a relative distance between the CCD camera 14 and the rear face of the sapphire 18, the image of the rear face of the sapphire 18 can be acquired by the CCD camera 14. Meanwhile, the near-infrared light emitted from the surface light source 22 goes through the mounting table 19, the sapphire 18, the condensed lens 17, the beam splitter 12, and the convex lens 13, and finally reaches the CCD camera 14. By reasonably adjusting a relative distance between the CCD camera 14 and the rear face of the sapphire 18, the image of the rear face of the sapphire 18 can be acquired by the CCD camera 14.

Figure 7:
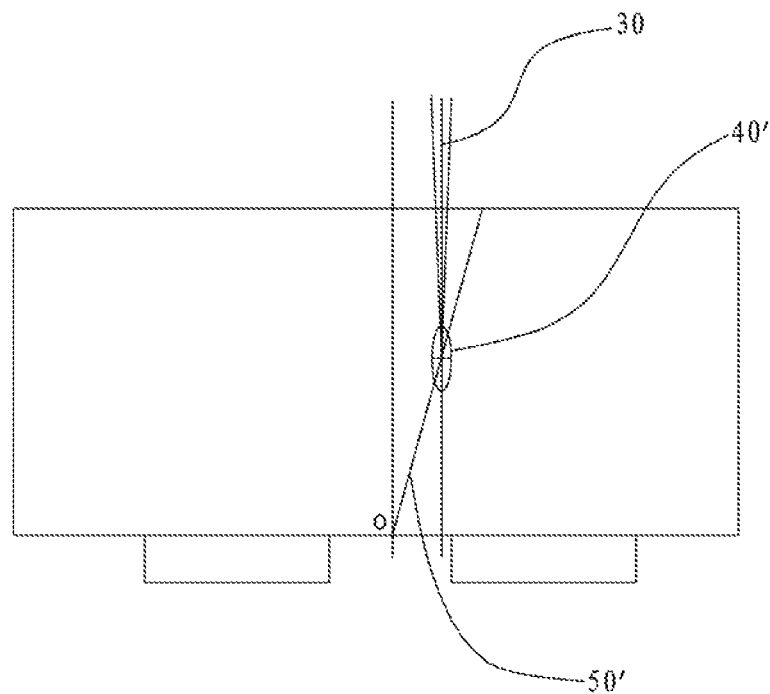
FIG. 7 is a section view illustrating a dicing method of a sapphire wafer after adjusting the processing portion according to an embodiment.
Figure 8:
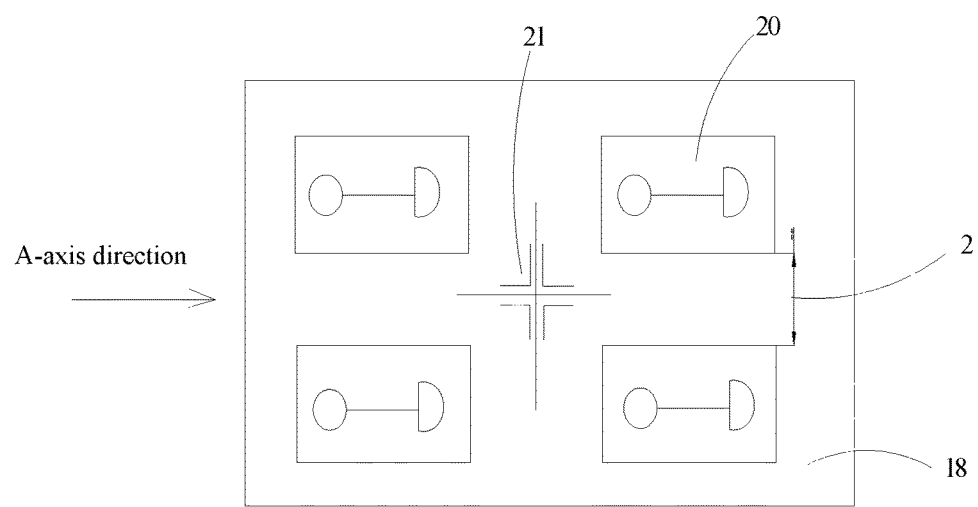
FIG. 8 is a top view illustrating a relative position between a processing plane of the sapphire and the center of the image according to an embodiment.

Referring to FIG. 4 and FIG. 8, the CCD camera 14 can also be used in the alignment of the dicing path of the electrode surface on the front face of the sapphire. The front face of the sapphire 18 is composed by single chip particles arranged periodically. The front face can be diced along an a-axis direction. The dicing path has a certain width. There is a crosshair at the center 21 of the CCD camera, which is used to align and identify the dicing path 2. Before dicing, the center of the CCD camera is aligned with the center of the dicing path 2. Specifically, FIG. 8 can be regarded as an image displayed by the monitor of the apparatus 7, where the center crosshair of the CCD camera is located at the geometric center of the displayed image. The image is acquired by turning on the surface light source 22 of FIG. 7 and adjusting a relative distance between the CCD camera 14 and the surface of the sapphire 18.

Light from the surface light source 22 can penetrate the mounting table and the sapphire 18, such that the images of the plane at any depth of the sapphire along the thickness direction can be captured by the CCD camera 14, those images include electrode pattern on the front face of the sapphire, the images of the dicing paths, the images of the converging points 4 inside the sapphire, and the images of the crack on the rear side of the sapphire, etc. The images of the different depths can be acquired by adjusting the relative distance between the CCD camera 14 and the surface of the sapphire 18. Specifically, regarding the crack on the rear side of the sapphire, the surface light source 22 and the point light source 8 can be switched on simultaneously, then the focus of the condensed lens is adjusted to the back side of the sapphire, the brightness of the surface light source and point source can be adjusted, such that the crack with the best sharpness can be obtained for capturing of the CCD camera 14. During the manufacturing of the LED chip, the coatings on the rear side of the sapphire may have differences, thus rendering different imaging effects. Accordingly, the present invention provides two lights sources for imaging, so as to solve the imaging differences due to the coating, such that the cracks on the rear side of the sapphire can be easily identified and acquired. In addition, the point light source 8 can be white light source, and the surface light source 22 can be a near-infrared light source.

In step 504, an edge detection is performed to the image to acquire a coordinate of a crack.

Specifically, after the apparatus 7 acquires the image of the sapphire, a denoising treatment is performed to the image, then the edge detection is performed to the denoised image using an edge detection algorithm. The edge of the crack is determined by the edge detection, and the coordinates of the points on the edge of the crack in the image is determined, which forms a coordinate set.

In step 506, an offset parameter is determined according to the coordinate of the crack.

Specifically, a center coordinate of the image is acquired, and a coordinates of the points on the edge of the crack are compared with the center coordinate, so as to determine the offset parameter of the crack with respect to the center coordinate of the image. The offset parameter can be used to indicate a positional relationship between the crack and the center of the image.

In step 508, a laser processing position is adjusted according to the offset parameter.

Specifically, the center of the image displayed by the apparatus 7 corresponds to the laser processing position, which is the position where the laser beam 16 is radiated to the sapphire. The apparatus 7 can adjust the incident position of the laser beam 16 to the sapphire according to the offset parameter.

In one embodiment, referring to FIG. 6 and FIG. 7, the position of the laser converging points 40' generated inside the wafer by the laser 30 is adjusted, and the laser processing position is adjusted so that the crack is oriented to the intermediate position of the dicing path. In the illustrated embodiment, since the crack 50 generated by processing at the intermediate position O of the dicing path needs to be shifted to the right, the laser processing apparatus can be moved rightward, such that the crack 50' is just located at the intermediate position O of the dicing path. It should be noted that the distance of moving to the right is no greater than half of the width of the dicing path. In addition, the distance of moving to the right can be the distance between the crack 50 and the intermediate position O of the dicing path.

In step 510, the sapphire is further processed in accordance with the adjusted laser processing position.

Specifically, the apparatus 7 controls the laser, such that the laser beam 16 generated by the laser is radiated on sapphire in accordance with the adjusted position.

In the illustrated embodiment, the image of the sapphire is acquired during the processing of the sapphire. Through the analysis and processing of the acquired image, the coordinates of the cracks in the sapphire is detected. The offset parameter is determined according to the coordinates of the cracks, such that the laser processing position can be adjusted according to the offset parameter. The offset parameter is finally obtained by image processing based on the coordinates of cracks in the image, thus the accuracy of processing of the sapphire, as well as the quality of the processed sapphire, can be improved.

Figure 9:
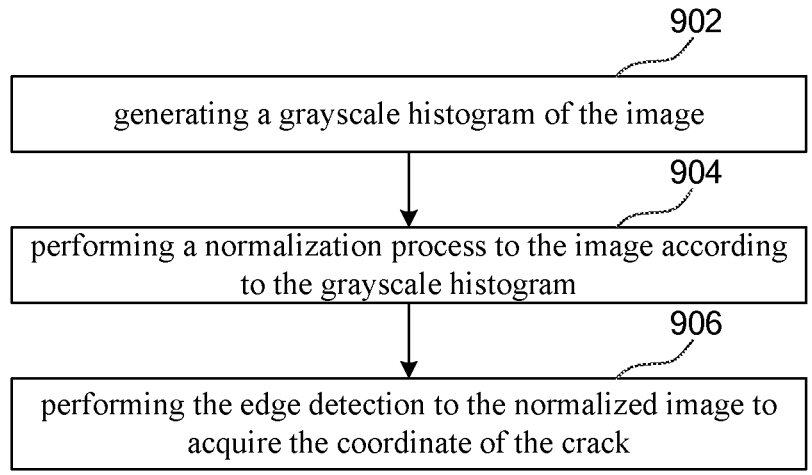
FIG. 9 is a flow chart of a method of extracting the coordinate of the crack according to an embodiment.
Figure 10:
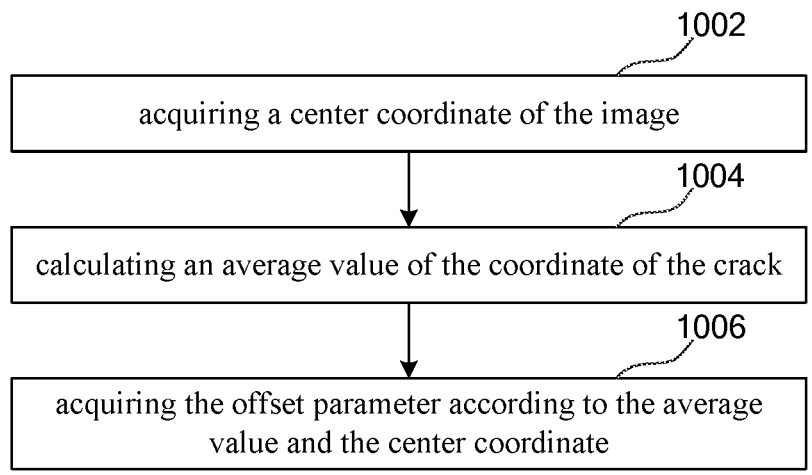
FIG. 10 is a flow chart of a method of calculating an offset parameter according to an embodiment.

Referring to FIG. 9, in one embodiment, the step 504 includes an image processing step, which specifically includes as follows:

In step 902, a grayscale histogram of the image is generated.

Specifically, the apparatus 7 counts the number of pixels of each grayscale value in the acquired image, and calculates the frequency of appearance of each grayscale value according to the number of pixels of each grayscale value, the grayscale histogram is then generated according to the calculated frequency of appearance of each grayscale value.

In step 904, a normalization process is performed to the image according to the grayscale histogram.

Specifically, the frequency of each grayscale value in the grayscale histogram is extracted, and the normalization process of the grayscale value is performed to the image according to the frequency of each grayscale value, such that the grayscale difference of the crack in the image becomes more apparent.

In step 906, the edge detection is performed to the normalized image to acquire the coordinate of the crack.

Specifically, an edge detection algorithm is employed to perform the edge detection to the normalized image, such that the edge of the crack of the sapphire in the image is detected, and the coordinates of the points of the edge of the crack in the image are extracted.

In one embodiment, the step 906 includes a drawing step for a region of interest, which specifically includes as follows: drawing a region of interest in the normalized image; and performing the edge detection to the region of interest to acquire the coordinate of the crack.

In one embodiment, the step 906 includes the following steps: performing the edge detection to the image to acquire a profile of the crack; and extracting a coordinate of the profile of the crack in the image.

Specifically, the apparatus 7 performs the edge detection to the image using a canny operator (i.e. a multi-stage algorithm for edge detection). The edge of the crack of the sapphire in the image is determined using the edge detection based on the canny operator, and the coordinates of the points of the edge of the crack in the image are calculated, thus forming a coordinate tuple as $[(x_1, y_1), (x_2, y_2), \ldots ]$. Furthermore, the region of interest is drawn in the image, and the edge detection is performed to the region of interest using canny operator.

In the illustrated embodiment, the image normalization process can ensure a more apparent crack in the image, such that the crack in the image can be easily identified. By drawing the region of interest containing the crack according to the normalized image, the interference of the image outside the area of interest is reduced, thus improving the accuracy of image processing.

In one embodiment, the step 506 includes a step of calculating the offset parameter, which specifically includes as follows:

In step 1002, a center coordinate of the image is acquired.

Specifically, the center coordinate of the image refers to the coordinate of the center of the field of view of the CCD camera 14, which is also the coordinate of the center of the image acquired by the CCD camera 14 displayed by the apparatus 7, and the center of the image corresponds to the laser processing position. The center of the image can be labeled with a particular tag, such as a red dot or a cross mark. The center coordinate of the image can be constant, for example, when coordinate system is established using the center coordinate as an origin, the center coordinates of the image is (0,0). The image is a partial image of the sapphire taken by the CCD according to a certain multiple during the laser processing. The crack generated during the processing of the sapphire can be observed from the partial image of the sapphire taken by the CCD according to a certain multiple. In step 1004, an average value of the coordinate of the crack is calculated.

Specifically, the coordinates corresponding to the point on the edge of the crack are extracted, and the average value of the coordinate corresponding to different coordinate axis are calculated, respectively, and the obtained average value according to the calculation results is regarded as the coordinates of the midpoint of cracks.

In step 1006, the offset parameter is acquired according to the average value and the center coordinate.

Specifically, the average value of the coordinates is compared with the center coordinate, so as to determine the relative position of the crack and the center of the image. The center of the image is corresponding to the laser processing position, thus the offset parameter of the laser processing position and the crack can be obtained.

In one embodiment, the step 1006 includes: calculating a difference between the average value and the center coordinate; and determining the offset parameter according to the difference, the offset parameter includes an offset orientation and an offset distance.

Specifically, the average value of the center of the crack obtained by calculating is extracted, the difference between the average value and the center coordinate is calculated, and the offset orientation of the center of the crack with respect to the center of the image is determined according to whether the difference is less than zero, and the offset distance is the absolute value of the difference.

For instance, the set of coordinates of the points on the edge of the crack is $[(x_1, y_1), (x_2, y_2), \ldots ]$, the center coordinate of the image is $(x_0, y_0)$, the average of the y-coordinate values of the points of the edge is compared with a y-coordinate value $y_0$ of the center of the image, the difference (Distance) between the average value and the $y_0$ is calculated, and the absolute value of the difference (|D|) between the average value and the $y_0$ is recorded. If Distance>0, then the crack will be offset upwardly relative to the center of the image; if Distance<0, then the crack will be offset downwardly relative to the center of the image, and the relative offset distance is |D|.

In one embodiment, the step 510 includes: extracting an offset orientation and an offset distance from the offset parameter; and moving a laser processing position towards the offset orientation by a distance equal to the offset distance.

Figure 11:
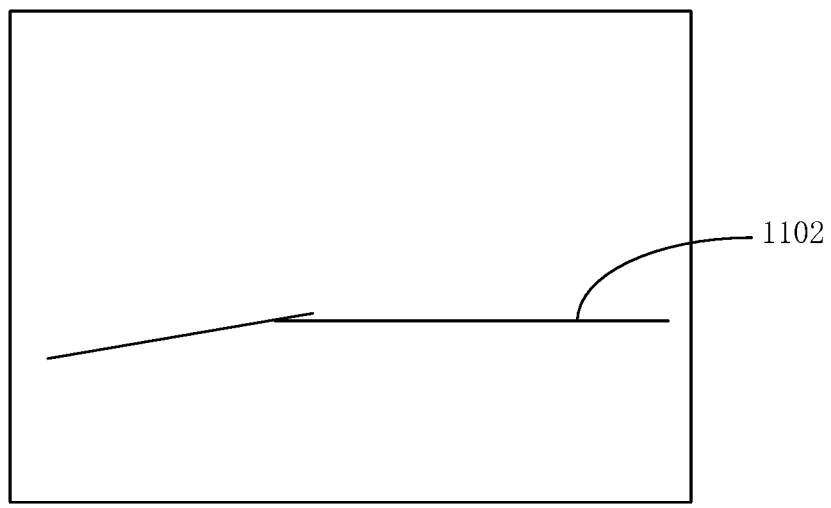
FIG. 11 illustrates a position of the crack in the acquired image according to an embodiment.

For instance, referring to FIG. 11, which is an image acquired by the CCD camera 14 displayed on the apparatus 7, the crack 1102 in the image is offset downwardly with respect to the center of the image. The offset parameter includes offsetting downwardly of the crack 1102 with respect to the center of the image. The crack of the sapphire will be moved with respect to the center of the image by adjusting the mounting table, and the moving distance is equal to the offset distance.

In the illustrated embodiment, the offset parameter of the crack of the sapphire and the laser processing position is determined by calculation, such that the accuracy of the determination is increased. In addition, the laser processing position is adjusted to the center of the crack in accordance with the offset parameter, and the sapphire will be processed at the cracking position, thus improving the yield of the production.

In one embodiment, a laser processing apparatus for the sapphire is provided, which includes a processor; and memory storing instructions, which, when executed by the processor cause the processor to perform operations including: acquiring an image of the sapphire during processing; performing an edge detection to the image to acquire a coordinate of a crack; determining an offset parameter according to the coordinate of the crack; adjusting a laser processing position according to the offset parameter; and further processing the sapphire in accordance with the adjusted laser processing position.

In one embodiment, acquiring the image of the sapphire includes: processing the sapphire along an intermediate point of any dicing path, thus forming the crack on the sapphire; and acquiring the image of the sapphire with the crack.

In one embodiment, acquiring the image of sapphire with the crack includes: controlling a light source and radiating light generated by the light source onto the sapphire with the crack; and acquiring the image of the sapphire radiated by the light.

In one embodiment, acquiring the image of the sapphire radiated by the light includes: transmitting an image capturing instruction to a CCD camera, and acquiring, by the CCD camera, the image of the sapphire radiated by the light in a field of view according to the image capturing instruction.

In one embodiment, performing the edge detection to the image to acquire the coordinate of the crack includes: generating a grayscale histogram of the image; performing a normalization process to the image according to the grayscale histogram; and performing the edge detection to the normalized image to acquire the coordinate of the crack.

In one embodiment, performing the edge detection to the normalized image to acquire the coordinate of the crack includes: drawing a region of interest in the normalized image; and performing the edge detection to the region of interest to acquire the coordinate of the crack.

In one embodiment, performing the edge detection to the image to acquire the coordinate of the crack includes: performing the edge detection to the image to acquire a profile of the crack; and extracting a coordinate of the profile of the crack in the image.

In one embodiment, determining an offset parameter according to the coordinate of the crack includes; acquiring a center coordinate of the image; calculating an average value of the coordinate of the crack; and acquiring the offset parameter according to the average value and the center coordinate.

In one embodiment, acquiring the offset parameter according to the average value and the center coordinate includes: calculating a difference between the average value and the center coordinate; and determining the offset parameter according to the difference, wherein the offset parameter comprises an offset orientation and an offset distance.

In one embodiment, adjusting a laser processing position according to the offset parameter includes: extracting an offset orientation and an offset distance from the offset parameter; and moving a laser processing position towards the offset orientation by a distance equal to the offset distance.

In the illustrated embodiment, the image of the sapphire is acquired during the processing of the sapphire. Through the analysis and processing of the acquired image, the coordinates of the cracks in the sapphire are detected. The offset parameter is determined according to the coordinates of the cracks, such that the laser processing position can be adjusted according to the offset parameter. The offset parameter is finally obtained by image processing based on the coordinates of cracks in the image, thus the accuracy of processing of the sapphire, as well as the quality of the processed sapphire, can be improved.

In one embodiment, a non-transitory computer-readable medium storing instructions, which, when executed by one or more processors cause the one or more processors to perform operations includes: acquiring an image of the sapphire during processing; performing an edge detection to the image to acquire a coordinate of a crack; determining an offset parameter according to the coordinate of the crack; adjusting a laser processing position according to the offset parameter; and further processing the sapphire in accordance with the adjusted laser processing position.

In the illustrated embodiment, the image of the sapphire is acquired during the processing of the sapphire. Through the analysis and processing of the acquired image, the coordinates of the cracks in the sapphire are detected. The offset parameter is determined according to the coordinates of the cracks, such that the laser processing position can be adjusted according to the offset parameter. The offset parameter is finally obtained by image processing based on the coordinates of cracks in the image, thus the accuracy of processing of the sapphire, as well as the quality of the processed sapphire, can be improved.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the description is illustrated and described herein with reference to certain embodiments, the description is not intended to be limited to the details shown. Modifications may be made in the details within the scope and range equivalents of the claims.

What is claimed is:

1. A laser processing method for a sapphire, comprising:
    acquiring an image of the sapphire during processing;
    performing an edge detection to the image to acquire a coordinate of a crack;
    determining an offset parameter according to the coordinate of the crack;
    adjusting a laser processing position according to the offset parameter; and
    further processing the sapphire in accordance with the adjusted laser processing position,
    wherein performing the edge detection to the image to acquire the coordinate of the crack comprises: generating a grayscale histogram of the image; performing a normalization process to the image according to the grayscale histogram; and performing the edge detection to the normalized image to acquire the coordinate of the crack, and
    wherein generating the grayscale histogram of the image comprises counting a number of pixels of each grayscale value in the acquired image, calculating the frequency of appearance of each grayscale value according to the number of pixels of each grayscale value, and generating the grayscale histogram according to the calculated frequency of appearance of each grayscale value.

2. The method according to claim 1, wherein acquiring the image of the sapphire comprises:
    processing the sapphire along an intermediate point of any dicing path, thus forming the crack on the sapphire; and
    acquiring the image of the sapphire with the crack.

3. The method according to claim 2, wherein acquiring the image of sapphire with the crack comprises:
    controlling a light source and radiating light generated by the light source onto the sapphire with the crack; and
    acquiring the image of the sapphire radiated by the light.

4. The method according to claim 3, wherein acquiring the image of the sapphire radiated by the light comprises:

transmitting an image capturing instruction to a CCD camera, and acquiring, by the CCD camera, the image of the sapphire radiated by the light in a field of view according to the image capturing instruction.

5. The method according to claim 4, further comprising displaying the image of the sapphire on a monitor, wherein the displayed image is a partial image magnified according to a certain multiple by the CCD camera during the laser processing such that the crack generated during the sapphire processing is observable from the partial image magnified according to the certain multiple.

6. The method according to claim 1, wherein performing the edge detection to the normalized image to acquire the coordinate of the crack comprises:

drawing a region of interest in the normalized image; and performing the edge detection to the region of interest to acquire the coordinate of the crack.

7. The method according to claim 1, wherein performing the edge detection to the image to acquire the coordinate of the crack comprises:

performing the edge detection to the image to acquire a profile of the crack; and extracting a coordinate of the profile of the crack in the image.

8. The method according to claim 7, further comprising performing the edge detection to the image using a canny operator and/or multi-stage algorithm for edge detection, wherein an edge of the crack of the sapphire in the image is determined using the edge detection based on the canny operator and the coordinates of the points of the edge of the crack in the image are calculated, forming a coordinate tuple.

9. The method according to claim 1, wherein determining an offset parameter according to the coordinate of the crack comprises:

acquiring a center coordinate of the image;

calculating an average value of the coordinate of the crack, wherein the coordinate of the crack includes a set of coordinates for points on an edge of the crack in the image, the set of coordinates being extracted during the edge detection performed on the image, and calculating the average value of the coordinate of the crack comprises calculating for each axis an average of values corresponding to the axis in the set of coordinates, wherein the average value of the coordinate of the crack includes coordinates for a midpoint of the edge of the crack in the image; and acquiring the offset parameter according to the average value and the center coordinate.

10. The method according to claim 9, wherein acquiring the offset parameter according to the average value and the center coordinate comprises:

calculating a difference between the average value and the center coordinate; and determining the offset parameter according to the difference, wherein the offset parameter comprises an offset orientation and an offset distance.

11. The method according to claim 10, wherein the offset orientation is determined according to whether the difference between the average value and the center coordinate is less than zero, and the offset distance is an absolute value of the difference between the average value and the center coordinate.

12. The method according to claim 11, wherein the crack is determined to be offset upwardly relative to the center of the image in response to the difference between the average value and the center coordinate being greater than zero, and the crack is determined to be offset downwardly relative to the center of the image in response to the difference between the average value and the center coordinate being less than zero.

13. The method according to claim 9, wherein calculating an average value of the coordinate of the crack comprises extracting coordinates corresponding to points on the edge of the crack and calculating the average value of the coordinates corresponding to respective coordinate axes, the calculated average value being regarded as coordinates of a midpoint of the crack.

14. The method according to claim 1, wherein adjusting a laser processing position according to the offset parameter comprises:

extracting an offset orientation and an offset distance from the offset parameter; and moving a laser processing position towards the offset orientation by a distance equal to the offset distance.

15. The method according to claim 1, wherein an edge of the crack is determined by the edge detection, and the coordinates of points on the edge of the crack in the image are determined, forming a coordinate set.

16. The method according to claim 1, wherein the offset parameter indicates a positional relationship between the crack and a center of the image, the center of the image corresponds to a laser processing position, which is a position where a laser beam is radiated to the sapphire, and the incident position of the laser beam to the sapphire is adjusted according to the offset parameter.

17. The method according to claim 16, wherein further processing the sapphire in accordance with the adjusted laser processing position comprises controlling the laser beam such that the laser beam is radiated on the sapphire in accordance with the adjusted laser processing position.

18. The method according to claim 1, wherein performing the normalization process to the image comprises extracting a frequency of each grayscale value in the grayscale histogram and performing the normalization process of the grayscale value according to the frequency of each grayscale value, such that the grayscale difference of the crack in the image becomes more apparent.

19. The method according to claim 18, wherein performing the edge detection to the normalized image to acquire the coordinate of the crack comprises employing an edge detection algorithm to perform the edge detection to the normalized image such that an edge of the crack of the sapphire in the image is detected, and the coordinates of the points of the edge of the crack are extracted.

* * * * *